United States Patent
Fan et al.

(10) Patent No.: US 10,433,422 B2
(45) Date of Patent: Oct. 1, 2019

(54) HIGH-SPEED PRINTED CIRCUIT BOARD AND DIFFERENTIAL WIRING METHOD THEREOF

(71) Applicants: Guangzhou Fastprint Circuit Tech Co., Ltd., Guangzhou (CN); Shenzen Fastprint Circuit Tech Co., Ltd., Shenzhen (CN); Yixing Silicon Valley Electronics Technology Co., Yixing (CN)

(72) Inventors: Hong Fan, Guangzhou (CN); Hongfei Wang, Guangzhou (CN); Bei Chen, Guangzhou (CN)

(73) Assignees: Guangzhou Fastprint Circuit Tech Co., Ltd., Guangzhou (CN); Shenzhen Fastprint Circuit Tech Co., Ltd., Shenzhen (CN); Yixing Silicon Valley Electronics Technology Co., Yixing (CN)

( * ) Notice: Subject to any disclaimer, the term of this patent is extended or adjusted under 35 U.S.C. 154(b) by 0 days.

(21) Appl. No.: 15/780,456

(22) PCT Filed: Aug. 26, 2016

(86) PCT No.: PCT/CN2016/096902
§ 371 (c)(1),
(2) Date: May 31, 2018

(87) PCT Pub. No.: WO2017/092428
PCT Pub. Date: Jun. 8, 2017

(65) Prior Publication Data
US 2018/0368260 A1      Dec. 20, 2018

(30) Foreign Application Priority Data

Dec. 4, 2015    (CN) .......................... 2015 1 0891395

(51) Int. Cl.
*H05K 1/02*         (2006.01)
*H05K 1/11*         (2006.01)
(Continued)

(52) U.S. Cl.
CPC ........ *H05K 1/115* (2013.01); *H01L 23/49816* (2013.01); *H01L 23/49822* (2013.01);
(Continued)

(58) Field of Classification Search
CPC ... H05K 1/02; H05K 1/11; H05K 1/18; H05K 3/00; H05K 3/10; H01L 23/00; H01L 23/48; H01L 23/66
(Continued)

(56) References Cited

U.S. PATENT DOCUMENTS

2004/0194999 A1    10/2004    Tomita et al.
2005/0110167 A1*   5/2005     Ramakrishnan ........................... H01L 23/49827
                                                                              257/786

(Continued)

FOREIGN PATENT DOCUMENTS

CN    103995942 A    8/2014
CN    104472024 A    3/2015
(Continued)

OTHER PUBLICATIONS

International Search Report and Written Opinion for Application No. PCT/CN2016/096902, dated Nov. 30, 2016, 12 pages.
(Continued)

*Primary Examiner* — Xiaoliang Chen
(74) *Attorney, Agent, or Firm* — Seyfarth Shaw LLP (57) ABSTRACT

Provided is a differential wiring method for a high-speed printed circuit board, including the following steps: setting a pre-set impedance required value $Z_2$ of a non-ball grid
(Continued)

array (BGA) region, determining the width $w_2$ of the second differential wire and the distance $d_2$ between the two second differential wires according to the pre-set impedance required value $Z_2$; calculating the width $w_1$ of the first differential wire and the distance $d_1$ between the two first differential wires, according to the distance $s_1$ between two adjacent rows of bonding pads in a BGA region bonding pad array and the minimum processable distance $s_2$ between the bonding pad and the first differential wire, where $w_1$ and $d_1$ should satisfy $2w_1+d_1 \leq s_1-2s_2$, while further calculating $w_1$ and $d_1$ according to a differential characteristic impedance formula; arranging the two first differential wires disposed oppositely to each other in the BGA region according to the determined $d_1$, and arranging the two second differential wires disposed oppositely to each other in the non-BGA region according to the determined $d_2$; connecting the first differential wire and the second differential wire corresponding thereto via a first connection wire; and connecting the first differential wire and the bonding pad corresponding thereto via a second connection wire.

7 Claims, 3 Drawing Sheets (51) Int. Cl.
*H05K 1/18* (2006.01)
*H05K 3/00* (2006.01)
*H05K 3/10* (2006.01)
*H01L 23/00* (2006.01)
*H01L 23/48* (2006.01)
*H01L 23/66* (2006.01)
*H01L 23/498* (2006.01)
*H05K 3/40* (2006.01)

(52) U.S. Cl.
CPC ............... *H05K 1/02* (2013.01); *H05K 1/11* (2013.01); *H05K 1/117* (2013.01); *H05K 3/4038* (2013.01)

(58) Field of Classification Search
USPC ........... 174/262, 267; 439/55; 361/821, 783; 257/737, 738, 773, 774, 786
See application file for complete search history.

(56) References Cited

U.S. PATENT DOCUMENTS

| | | | |
|---|---|---|---|
| 2006/0021795 A1* | 2/2006 | Howard | H01L 23/49816 174/267 |
| 2011/0090665 A1* | 4/2011 | Korony | H01C 1/148 361/821 |
| 2012/0001327 A1* | 1/2012 | Zhou | H01L 23/50 257/738 |
| 2012/0187564 A1* | 7/2012 | Tsuge | H01L 23/49822 257/773 |
| 2014/0027157 A1 | 1/2014 | Yu et al. | |
| 2014/0104802 A1* | 4/2014 | Oikawa | H05K 1/18 361/783 |
| 2015/0061128 A1* | 3/2015 | Ramakrishnan | H01L 23/50 257/738 |
| 2015/0214173 A1* | 7/2015 | Wen | H01L 24/17 257/737 |
| 2015/0357760 A1* | 12/2015 | Aihara | H05K 1/115 439/55 |
| 2016/0358866 A1* | 12/2016 | Zu | H01L 23/66 |
| 2017/0013716 A1* | 1/2017 | Chandra | H05K 1/025 |

FOREIGN PATENT DOCUMENTS

| | | |
|---|---|---|
| CN | 105407627 A | 3/2016 |
| CN | 205160910 U | 4/2016 |
| WO | 2017092428 A1 | 6/2017 |

OTHER PUBLICATIONS

Chinese Search Report & First Office Action for Application No. 201510891395.3, dated Sep. 1, 2017, 9 pages.

* cited by examiner

HIGH-SPEED PRINTED CIRCUIT BOARD AND DIFFERENTIAL WIRING METHOD THEREOF

CROSS REFERENCE TO RELATED APPLICATIONS

This is a National Stage application of PCT/CN2016/096902, filed Aug. 26, 2016, which claims priority to Chinese Patent Application No. 201510891395.3, filed Dec. 4, 2015, the disclosures of which are incorporated herein by reference in their entirety.

TECHNICAL FIELD

The present disclosure relates to the field of circuit technology, and more particularly, to a high-speed printed circuit board and a differential wiring method thereof.

BACKGROUND

A printed circuit board includes at least a wiring layer, a shielding layer and a dielectric layer, wherein the wiring layer includes signal wires and BGA (Ball Grid Array) region and non-BGA region. A plenty of known differential wiring methods for PCBs tend to generally control the wiring width within the non-BGA region in a reasonable range as possibly, of which the wire width/distance is larger; the distance of the pin array in the BGA region is instead smaller, wherein designers generally use the same wire width as the difference pair in the non-BGA region, and reduce the distance between the difference pair in the BGA region, interconnecting with the non-BGA region. However, in fact this design is difficult to ensure the impedance consistency between the BGA region and the non-BGA region, resulting in impedance fluctuation and affecting the signal transmission quality. Specially with the booming development of 4G and 5G high-speed communication networks, requirements for link impedance consistency during high-speed signal transmission are getting higher and higher, which means that for maintaining high quality of high-speed signal transmission the transmission channel impedance must be controlled to keep very stable. The conventional wiring methods of PCBs cannot satisfy the requirements for high-speed signal quality.

SUMMARY

In view of the above, the present disclosure is to overcome the defects of the prior art by providing a high-speed printed circuit board and a differential wiring method thereof, which can ensure the consistency of the signal transmission link impedances, improving the signal transmission quality. Thereby the high-speed signal transmission is ensured.

The technical solution thereof is shown as follows:

A high-speed printed circuit board is provided, which includes a wiring layer, a dielectric layer and a shielding layer laminated sequentially. The wiring layer includes a BGA region, a non-BGA region and two differential transmission lines disposed oppositely to each other. Each of the differential transmission lines includes a first differential wire located in the BGA region, a second differential wire located in the non-BGA region and a first connection wire configured to connect the first differential wire and the second differential wire. The width of the first differential wire is less than the width of the second differential wire. The distance between the two first differential wires is less than the distance between the two second differential wires. The width of the first differential wire gradually increases from the BGA region to the non-BGA region. The distance between the two first connection wires gradually increases from the BGA region to the non-BGA region.

In one embodiment, the width of the first differential wire and the distance between the two first differential wires satisfy the formula:

$$Z_2 \approx 2 * \frac{87}{\sqrt{\varepsilon_r + 1.41}} \ln \frac{5.98h}{0.8w_1 + t} \left(1 - 0.48 e^{-0.96 \frac{d_1}{h}}\right)$$

wherein, $Z_2$ is a pre-set impedance required value of the non-BGA region, $w_1$ is the width of the first differential wire, $d_1$ is the distance between the two first differential wires, h is the thickness of the dielectric layer, $\varepsilon_r$ is the dielectric constant of the dielectric layer and t is the cooper thickness of the wiring layer.

In one embodiment, the BGA region is provided with bonding pads arranged in an array. The two first differential wires are located between two adjacent rows of the bonding pads. The width of the first differential wire and the distance between the two differential wires further satisfy the formula:

$$2w_1 + d_1 \leq s_1 - 2s_2,$$

wherein, $s_1$ is the distance between the two adjacent rows of the bonding pads, $s_2$ is the minimum processable distance from the bonding pad to the first differential wire.

In one embodiment, the width of the second differential wire and the distance between the two second differential wires satisfy the formula:

$$Z_2 \approx 2 * \frac{87}{\sqrt{\varepsilon_r + 1.41}} \ln \frac{5.98h}{0.8w_2 + t} \left(1 - 0.48 e^{-0.96 \frac{d_2}{h}}\right)$$

wherein, $Z_2$ is a pre-set impedance required value of the non-BGA region, $w_2$ is the width of the second differential wire, $d_2$ is the distance between the two second differential wires, h is the thickness of the dielectric layer, $\varepsilon_r$ is the dielectric constant of the dielectric layer and t is the cooper thickness of the wiring layer.

In one embodiment, the width of one end of the first connection wire close to the first differential wire is equal to the width of the first differential wire. The width of the other end of the first connection wire close to the second differential wire is equal to the width of the second differential wire.

In one embodiment, each of both the differential transmission lines further includes a first bonding pad located in the BGA region. One end of the first differential wire away from the second differential wire is connected to the first bonding pad via the second connection wire. The distance between the two first differential wires is less than the distance between the two first bonding pads. The width of the second connection wire gradually increases in the direction from the first differential wire to the first bonding pad. The distance between the two second differential wires gradually increases in the direction from the first differential wire to the first bonding pad.

This technical solution further provides a differential wiring method for a high-speed printed circuit board. The high-speed printed circuit board includes a wiring layer, a dielectric layer and a shielding layer laminated sequentially. The wiring layer includes a BGA region, a non-BGA region and two first differential wires located in the BGA region and disposed oppositely to each other, two second differential wires located in the non-BGA region and disposed oppositely to each other. The BGA region is provided with bonding pads arranged in an array. The bonding pads arranged in the array include two first bonding pads corresponding to the first differential wires in a one-to-one manner. The first bonding pad is connected to one end of the first differential wire away from the second differential wire; the differential wiring method includes the following steps of:

setting a pre-set impedance required value $Z_2$ of the non-BGA region, and determining the width $w_2$ of the second differential wire and the distance $d_2$ between the two second differential wires according to the pre-set impedance required value $Z_2$;

calculating the width $w_1$ of the first differential wire and the distance $d_1$ between the two first differential wires, according to the distance $s_1$ between two adjacent rows of the bonding pads in the BGA region and the minimum processable distance $s_2$ from the bonding pad to the first differential wire, wherein $w_1$ and $d_1$ should satisfy $2w_1 + d_1 \leq s_1 - 2s_2$, while further calculating $w_1$ and $d_1$ according to the formula $$Z_2 \approx 2 * \frac{87}{\sqrt{\varepsilon_r + 1.41}} \ln \frac{5.98h}{0.8w_1 + t}\left(1 - 0.48e^{-0.96\frac{d1}{h}}\right),$$

wherein h is the thickness of the dielectric layer, $\varepsilon_r$ is the dielectric constant of the dielectric layer and t is the cooper thickness of the wiring layer;

processing the first differential wires and the second differential wires according to the determined $w_1$ and $w_2$;

arranging the two first differential wires disposed oppositely to each other in the BGA region according to the determined $d_1$, wherein the two first differential wires are located between two adjacent rows of bonding pads, while arranging the two second differential wires disposed oppositely to each other in the non-BGA region according to the determined $d_2$;

connecting the first differential wire and the second differential wire corresponding thereto via a first connection wire;

connecting the first differential wire and the first bonding pad corresponding thereto via a second connection wire, such that the first bonding pads, the second connection wires, the first differential wires, the first connection wires and the second differential wires are connected sequentially and cooperate with each other respectively, so as to form two differential transmission lines disposed oppositely to each other.

In one embodiment, after further calculating the values of $w_1$ and $d_1$ according to the formula $$Z_2 \approx 2 * \frac{87}{\sqrt{\varepsilon_r + 1.41}} \ln \frac{5.98h}{0.8w_1 + t}\left(1 - 0.48e^{-0.96\frac{d1}{h}}\right),$$

the method further includes the following step:

selecting the maximal value of $w_1$ as the final wire width of the first differential wire in the BGA region and the $d_1$ corresponding to the maximal value of $w_1$ as the final distance between the two first differential wires in the BGA region from all of $w_1$ and $d_1$ that satisfy the requirements.

The beneficial effects of the present disclosure lie in that: according to the difference characteristic impedance formula it is known that, the impedances of the differential transmission pairs (two differential transmission lines) of the circuit board are determined by the dimension, the distance of the differential wires and the dielectric layer supporting the differential wires together. Since the first differential wire and the second differential wire have a same dielectric layer and thickness of the same, the parameters that affect their impedances are only their dimensions and distance. On the high-speed printed circuit board provided by the present disclosure, the width of the first differential wire thereof located in the BGA region is less than the width of the second differential wire located in the non-BGA region, while the distance between the two first differential wires is less than the distance between the two second differential wires. Since the distance of the pin array is smaller in the BGA region, the distance between the first differential wires is reduced. Meanwhile reducing the width of the first differential wire in comparison with that in the non-BGA region can ensure the impedance consistency of the BGA region and the non-BGA region. Meanwhile connections between the first differential wires and the second differential wires are prone to occur the impedance fluctuation, since a difference is present in width (a sum of the widths of the two differential wires and the distance between the two differential wires) of the differential pair on the both sides of the connections. By connecting the first differential wires and the second differential wires with the first connection wires, of which the width gradually increases from the BGA region to the non-BGA region, and gradually increases the distance between the two first connection wires from the BGA region to the non-BGA region, it is possible to reduce the impedance variation magnitude of the connections, ensuring the consistency of the transmission link impedances, improving the signal transmission quality, whereby the high-speed signal transmission is ensured. Since the present disclosure has a reasonable design and a simple structure, it is less difficult to achieve the impedance consistency in comparison with changing other parameters such as the dielectric constant of the dielectric layer and the like, so as to facilitate the manufacture.

According to the differential characteristic impedance formula $$Z_2 \approx 2 * \frac{87}{\sqrt{\varepsilon_r + 1.41}} \ln \frac{5.98h}{0.8w_1 + t}\left(1 - 0.48e^{-0.96\frac{d1}{h}}\right),$$

the wire width of the first differential wire in the BGA region and the distance between the two first differential wires are determined. $Z_2$ in the formula is the pre-set impedance required value of the non-BGA region, therefore the wire width and distance of the first differential wires determined by the formula can ensure the impedance consistency of the differential transmission pairs in the BGA region and the non-BGA region.

The wire width and the distance of the first differential wires determined by the differential characteristic impedance formula should further satisfy the formula $2w_1 + d_1 \leq s_1 - 2s_2$, so as to ensure the reliability and machinability of circuit boards during actual processing. In the formula, $w_1$ is the width of the first differential wire, $d_1$ is the distance between the two first differential wires, $s_1$ is the distance between the two adjacent rows of bonding pads, and $s_2$ is the minimum processable distance from the bonding pad to the first differential wire.

The width of one end of the first connection wire close to the first differential wire is equal to the width of the first differential wire. The width of the other end of the first connection wire close to the second differential wire is equal to the width of the second differential wire, so that the impedance between the first differential wire and the second differential wire is continuous and facilitates a smooth transition of the impedance, whereby the impedance fluctuation and the abrupt transition of the impedance are further reduced.

Since the distance between the two first bonding pads is greater than the distance between the two first differential wires, for ensuring the impedance consistency of the connection between the first differential wire and the first bonding pad, the reduction of impedance fluctuation between the first differential wire and the first bonding pad can be so ensured that the first differential wire and the first bonding pad are connected via the second connection wire, of which the width gradually increases from the first differential wire to the first bonding pad, facilitating the formation of an impedance-consistent and integrate signal transmission channel.

The maximal value of $w_1$ is selected as the final wire width of the first differential wire in the BGA region and the $d_1$ corresponding to the maximal value of $w_1$ is selected as the final distance between the two first differential wires in the BGA region from all of $w_1$ and $d_1$ that satisfy the requirements. Since the greater the wire width of transmission wires is, the smaller the loss thereof is under the same conditions, designing a greater wire width of transmission wires can therefore reduce the loss effectively during transmission processing on the basis of controlling the BGA region to have a high impedance consistency, so that the integrity of the signal transmission can be better ensured.

EXPLANATION OF THE REFERENCE NUMERALS

100. BGA region; 110. first differential wire; 120. first bonding pad; 200. non-BGA region; 210. second differential wire; 310. first connection wire; 320. second connection wire.

DETAILED DESCRIPTION OF THE EMBODIMENTS

The following describes in detail the embodiments of the present disclosure.

Figure 1:
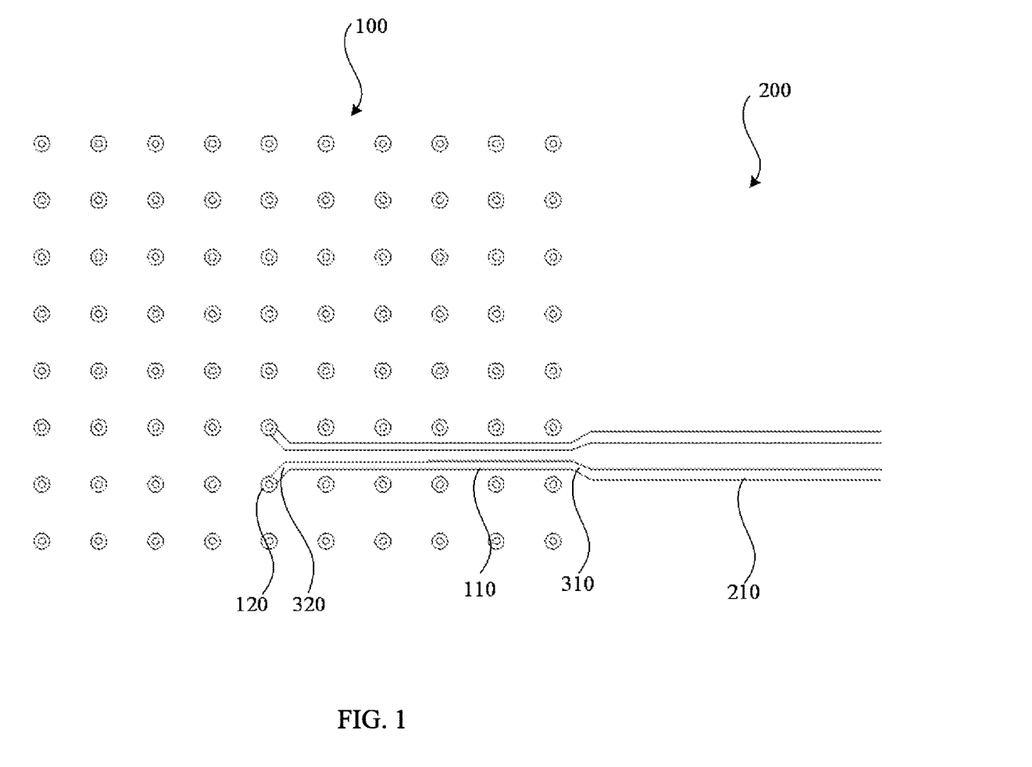
FIG. 1 is a schematic diagram of the high-speed printed circuit board according to the embodiment of the present disclosure.

As shown in FIG. 1, a high-speed printed circuit board is provided, which includes at least a wiring layer, a dielectric layer (not identified in drawings) and a shielding layer (not identified in drawings). The wiring layer includes a BGA region 100, a non-BGA region 200 and two differential transmission lines disposed oppositely to each other. Each of the two differential transmission lines includes a first differential wire 110 located in the BGA region 100, a second differential wire 210 located in the non-BGA region 200 and a first connection wire 310 configured to connect the first differential wire 110 and the second differential wire 210. The width of the first differential wire 110 is less than the width of the second differential wire 210, and the distance between the two first differential wires 110 is less than the distance between the two second differential wires 210. The width of the first connection wire 310 gradually increases from the BGA region 100 to the non-BGA region 200, and the distance between the two first connection wires 310 gradually increases from the BGA region 100 to the non-BGA region 200.

According to the difference characteristic impedance formula it is known that, the impedances of the differential transmission pairs of the circuit board are determined by the dimensions, the distance of the differential wires and the dielectric layer supporting the differential wires together. Since the first differential wire 110 and the second differential wire 210 have a same dielectric layer and a same thickness of the dielectric layer, the parameters that affect the impedances of the transmission lines are only the dimensions and distance of the transmission wires. On the high-speed printed circuit board provided by the present disclosure, the width of the first differential wire 110 thereof located in the BGA region 100 is less than the width of the second differential wire 210 located in the non-BGA region 200, while the distance between the two first differential wires 110 is less than the distance between the two second differential wires 210. Since the distance of the pin array is smaller in the BGA region 100, the distance between the first differential wires 110 is reduced. Meanwhile reducing the width of the first differential wire 110 in comparison with that in the non-BGA region 200 can ensure the impedance consistency of the BGA region 100 and the non-BGA region 200. Meanwhile connections between the first differential wires 110 and the second differential wires 210 are prone to occur the impedance fluctuation, since a difference is present in width (a sum of the widths of the two differential wires and the distance between the two differential wires) of the difference pair on the both sides of the connections. If the first differential wire 110 and the second differential wire 210 are connected by a straight wire with a certain width, since the wire width of the connection wire is constant and the distance therebetween shows a tendency for increasing or decreasing, the impedance will also show a tendency for increasing or decreasing in a short time. By connecting the first differential wire 110 and the second differential wire 210 with the first connection wire 310 having a trapezoidal structure, the impedance variation magnitude of the connections can be reduced to ensure the consistency of the transmission line impedances and improve the signal transmission quality. The width of the first connection wire 310 gradually increases from the BGA region 100 to the non-BGA region 200, and the distance between the two first connection wires 310 gradually increases from the BGA region 100 to the non-BGA region 200. Since the present disclosure has a simple structure and a reasonable design, the designing difficulty of the present disclosure is less than that of changing other parameters such as the dielectric constant of the dielectric layer and the like to achieve the impedance consistency, so as to facilitate the manufacture.

The BGA region 100 is provided with bonding pads arranged in an array, i.e. a bonding pad array. The bonding pad array includes two first bonding pads 120. Each of the two differential transmission lines further includes the first bonding pad 120, and one end of each first differential wire 110 away from the second differential wire 210 is connected to the first bonding pad 120 via the second connection wire 320. Since the distance between the two first differential wires 110 is less than the distance between the two first bonding pads 120, for ensuring the impedance consistency of the connection between the first differential wire 110 and the first bonding pad 120, it is possible to design a second connection wire 320 having a trapezoidal structure to connect the first differential wire 110 and the first bonding pad 120, ensuring the reduction of the impedance fluctuation of the connection between the first differential wire 110 and the first bonding pad 120, facilitating the formation of an impedance-consistent and integrate signal transmission channel. The width of the second connection wire 320 gradually increases in the direction from the first differential wire 110 to the first bonding pad 120, and the distance between the two second connection wires 320 gradually increases in the direction form the first differential wire 110 to the first bonding pad 120.

In this embodiment, in the non-BGA region 200, the width of the second differential wire 210 and the distance between the two second differential wires 210 satisfy the formula:

$$Z_2 \approx 2 * \frac{87}{\sqrt{\varepsilon_r + 1.41}} \ln \frac{5.98h}{0.8w_2 + t}\left(1 - 0.48e^{-0.96\frac{d_2}{h}}\right)$$

wherein, $Z_2$ is a pre-set impedance required value of the non-BGA region 200, $w_2$ is the width of the second differential wire 210, $d_2$ is the distance between the two second differential wires 210, h is the thickness of the dielectric layer, $\varepsilon_r$ is the dielectric constant of the dielectric layer and t is the cooper thickness of the wiring layer.

Meanwhile the width of the first differential wire 110 and the distance of the two first differential wires 100 satisfy the formula:

$$Z_2 \approx 2 * \frac{87}{\sqrt{\varepsilon_r + 1.41}} \ln \frac{5.98h}{0.8w_1 + t}\left(1 - 0.48e^{-0.96\frac{d_1}{h}}\right)$$

wherein, $w_1$ is the width of the first differential wire 100, $d_1$ is the distance between the two first differential wires 100, h is the thickness of the dielectric layer, $\varepsilon_r$ is the dielectric constant of the dielectric layer, t is the cooper thickness of the wiring layer, $Z_2$ is the pre-set impedance required value of the non-BGA region 200. Therefore, the width and the distance of the first differential wires 110 determined by the formula can ensure that the impedances of the differential transmission pairs (the two first differential wires 100 or the two second differential wires 210) in the BGA region and in the non-BGA region 200 are equal or approximate.

The wire width and the distance of the first differential wires 110 determined by the differential characteristic impedance formula should further satisfy the formula $2w_1 + d_1 \leq s_1 - 2s_2$, so as to ensure the reliability and machinability of circuit boards during actual processing. In the formula, $w_1$ is the width of the first differential wire 110, $d_1$ is the distance between the first differential wires 110, $s_1$ is the distance between the two adjacent rows of bonding pads, and $s_2$ is the minimum processable distance from one of the rows of bonding pads to the first differential wire 110 adjacent thereto.

The width of one end of the first connection wire 310 close to the first differential wire 110 is equal to the width of the first differential wire 110. The width of the other end of the first connection wire 310 close to the second differential wire 210 is equal to the width of the second differential wire 210, so that the impedance between the first differential wire 110 and the second differential wire 210 is continuous and facilitates a smooth transition of the impedance, whereby the impedance fluctuation and the abrupt transition of the impedance are further reduced. In this embodiment, the second differential wire 320 can employ the same specification as that of the first connection wire 310, i.e. the width of one end of the second connection wire 320 close to the first differential wire 110 is equal to the width of the first differential wire 110, and the width of the other end of the second connection wire 320 close to the bonding pad 120 is equal to the width of the second differential wire 210, so as to facilitate the manufacture.

Figure 2:
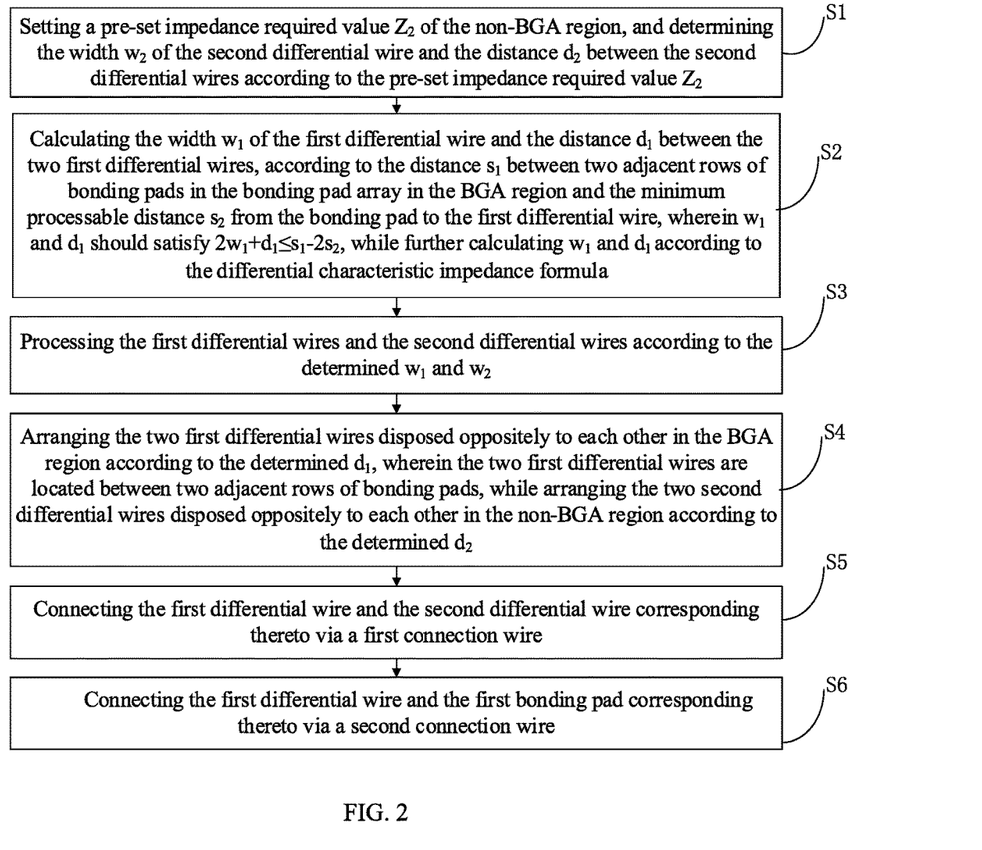
FIG. 2 is a flowchart of a differential wiring method of the high-speed printed circuit board according to the embodiment of the present disclosure.

As shown in FIG. 2, a differential wiring method of such a high-speed printed circuit board specially includes the following steps of:

S1. setting a pre-set impedance required value $Z_2$ of the non-BGA region 200, and determining the width $w_2$ of the second differential wire 210 and the distance $d_2$ between the second differential wires 210 according to the pre-set impedance required value $Z_2$, particularly determining $w_2$ and $d_2$ according to the formula $$Z_2 = 2 * \frac{87}{\sqrt{\varepsilon_r + 1.41}} \ln \frac{5.98h}{0.8w_2 + t}\left(1 - 0.48e^{-0.96\frac{d_2}{h}}\right)$$

and the actual loss requirements;

S2. calculating the width $w_1$ of the first differential wire 110 and the distance $d_1$ between the two first differential wires 110, according to the distance $s_1$ between two adjacent rows of bonding pads in the bonding pad array in the BGA region 100 and the minimum processable distance $s_2$ from the bonding pad to the first differential wire 110, wherein $w_1$ and $d_1$ should satisfy $2w_1 + d_1 \leq s_1 - 2s_2$, while further calculating $w_1$ and $d_1$ according to the formula $$Z_2 \approx 2 * \frac{87}{\sqrt{\varepsilon_r + 1.41}} \ln \frac{5.98h}{0.8w_1 + t}\left(1 - 0.48e^{-0.96\frac{d_1}{h}}\right);$$

S3. processing the first differential wires 110 and the second differential wires 210 according to the determined $w_1$ and $w_2$;

S4. arranging the two first differential wires 110 disposed oppositely to each other in the BGA region 100 according to the determined $d_1$, wherein the two first differential wires 110 are located between two adjacent rows of bonding pads, while arranging the two second differential wires 210 disposed oppositely to each other in the non-BGA region 200 according to the determined $d_2$;

S5. connecting the first differential wire 110 and the second differential wire 210 corresponding thereto via a first connection wire 310;

S6. connecting the first differential wire 110 and the first bonding pad 120 corresponding thereto via a second connection wire 320, such that the first bonding pads 120, the second connection wires 320, the first differential wires 110, the first connection wires 310 and the second differential wires 210 are connected sequentially and cooperate with each other respectively, so as to form two differential transmission lines disposed oppositely to each other.

In this embodiment, after further calculating the values of $w_1$ and $d_1$ according to the formula $$Z_2 \approx 2 * \frac{87}{\sqrt{\varepsilon_r + 1.41}} \ln \frac{5.98h}{0.8w_1 + t}\left(1 - 0.48e^{-0.96\frac{d1}{h}}\right),$$

the method further includes the following step:

selecting the maximal value of $w_1$ as the final wire width of the first differential wire 110 in the BGA region 100 and the $d_1$ corresponding to the maximal value of $w_1$ as the final distance between the two first differential wires 110 in the BGA region 100 from all of $w_1$ and $d_1$ that satisfy the requirements. Since the greater the wire width of transmission wires is, the smaller the loss thereof is under the same conditions, designing a greater wire width of transmission wires can therefore reduce the loss effectively during transmission processing on the basis of controlling the BGA region to have a high impedance consistency, so that the integrity of the signal transmission can be better ensured.

Figure 3:
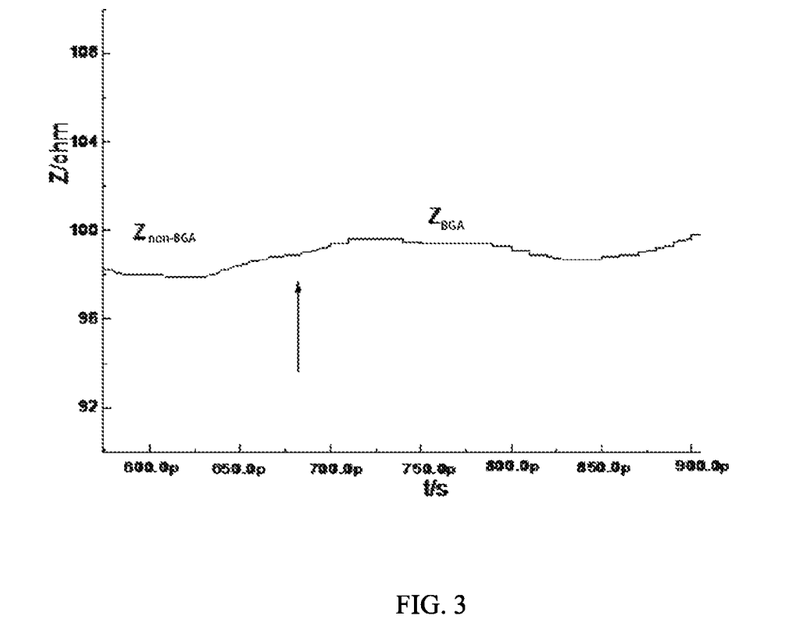
FIG. 3 is a TDR curve according to the embodiment of the present disclosure.

The actual design of the high-speed printed circuit board according to the present disclosure can be referred to as follows: designing the differential transmission pairs with $Z_2$=100 ohm, in the non-BGA region 200, the wire width $w_2$=5 mil, the distance $d_2$=8 mil; in the BGA region 100, the array distance $s_1$ of the BGA bonding pads is 18 mil, the minimum processable distance is 2.5 mil, employing the wire width $w_1$=4.3 mil, the distance $d_1$=4.4 mil; both the first connection wires 310 and the second connection wires 320 are trapezoidal wires that the widths of the both ends thereof are 4.3 mil and 5 mil. The test results are shown as in the TDR (Time-Domain Reflectometry) measurement curve in FIG. 3. As known from FIG. 3, the impedance fluctuation of the connections (i.e. the curve corresponding to the arrow in the FIG.) between the BGA region 100 and the non-BGA region 200 is smaller, which is only within 1 ohm. The TDR curve thereof is relatively smooth, indicating that the embodiment achieves the effect of consistent transmission link impedance.

The technical features of the above embodiments may be combined arbitrarily, for brevity of the description, all possible combinations of the various technical features in the above embodiments are not described, however, as long as there is no contradiction in the combinations of these technical features, they should be considered as within the scope of the description.

The above embodiments merely illustrate several embodiments of the present disclosure, and the description thereof is relatively specific and detailed, but it should not be construed as a limitation on the scope of the invention patent. It should be noted that those skilled in the art can also make several variations and improvements without departing from the concept of the present disclosure, and all of these are within the protection scope of the present disclosure. Therefore, the protection scope of the invention patent shall be subject to the appended claims.

What is claimed is:

1. A high-speed printed circuit board, comprising a wiring layer, a dielectric layer and a shielding layer laminated sequentially, wherein the wiring layer comprises a BGA region, a non-BGA region and two differential transmission lines disposed oppositely to each other, each of both the differential transmission lines comprises a first differential wire located in the BGA region, a second differential wire located in the non-BGA region and a first connection wire configured to connect the first differential wire and the second differential wire, the width of the first differential wire is less than the width of the second differential wire, the distance between the two first differential wires is less than the distance between the two second differential wires, the width of the first differential wire increases gradually from the BGA region to the non-BGA region, and the distance between the two first connection wires increases gradually from the BGA region to the non-BGA region, wherein the width of the first differential wire and the distance between the two first differential wires satisfy a formula:

$$Z_2 \approx 2 * \frac{87}{\sqrt{\varepsilon_r + 1.41}} \ln \frac{5.98h}{0.8w_1 + t}\left(1 - 0.48e^{-0.96\frac{d1}{h}}\right)$$

wherein, $Z_2$ is a pre-set impedance required value of the non-BGA region, $w_1$ is the width of the first differential wire, $d_1$ is the distance between the two first differential wires, h is the thickness of the dielectric layer, $\varepsilon_r$ is the dielectric constant of the dielectric layer and t is the cooper thickness of the wiring layer.

2. The high-speed printed circuit board of claim 1, wherein the BGA region is provided with bonding pads arranged in an array, the two first differential wires are located between two adjacent rows of the bonding pads, the width of the first differential wire and the distance between the two differential wires further satisfy a formula:

$$2w_1 + d_1 \leq s_1 - 2s_2,$$

wherein, $s_1$ is the distance between the two adjacent rows of the bonding pads, $s_2$ is the minimum processable distance from the bonding pad to the first differential wire.

3. The high-speed printed circuit board of claim 1, wherein the width of one end of the first connection wire close to the first differential wire is equal to the width of the first differential wire, the width of the other end of the first connection wire close to the second differential wire is equal to the width of the second differential wire.

4. The high-speed printed circuit board of claim 1, wherein each of both the differential transmission lines further comprises a first bonding pad located in the BGA region, an end of each first differential wire away from the second differential wire is connected to the first bonding pad via a second connection wire, the distance between the two first differential wires is less than the distance between the two first bonding pads, the width of the second connection wire increases gradually in the direction from the first differential wire to the first bonding pad, the distance between the two second connection wires increases gradually in the direction from the first differential wire to the first bonding pad.

5. A high-speed printed circuit board, comprising a wiring layer, a dielectric layer and a shielding layer laminated sequentially, wherein the wiring layer comprises a BGA region, a non-BGA region and two differential transmission lines disposed oppositely to each other, each of both the differential transmission lines comprises a first differential wire located in the BGA region, a second differential wire located in the non-BGA region and a first connection wire configured to connect the first differential wire and the second differential wire, the width of the first differential wire is less than the width of the second differential wire, the distance between the two first differential wires is less than the distance between the two second differential wires, the width of the first differential wire increases gradually from the BGA region to the non-BGA region, and the distance between the two first connection wires increases gradually from the BGA region to the non-BGA region, wherein the width of the second differential wire and the distance between the two second differential wires satisfy a formula:

$$Z_2 = 2 * \frac{87}{\sqrt{\varepsilon_r + 1.41}} \ln \frac{5.98h}{0.8w_2 + t}\left(1 - 0.48 e^{-0.96\frac{d_2}{h}}\right)$$

wherein, $Z_2$ is a pre-set impedance required value of the non-BGA region, $w_2$ is the width of the second differential wire, $d_2$ is the distance between the two second differential wires, h is the thickness of the dielectric layer, $\varepsilon_r$ is the dielectric constant of the dielectric layer and t is the cooper thickness of the wiring layer.

6. The high-speed printed circuit board of claim 5, wherein the width of one end of the first connection wire close to the first differential wire is equal to the width of the first differential wire, the width of the other end of the first connection wire close to the second differential wire is equal to the width of the second differential wire.

7. The high-speed printed circuit board of claim 5, wherein each of both the differential transmission lines further comprises a first bonding pad located in the BGA region, an end of each first differential wire away from the second differential wire is connected to the first bonding pad via a second connection wire, the distance between the two first differential wires is less than the distance between the two first bonding pads, the width of the second connection wire increases gradually in the direction from the first differential wire to the first bonding pad, the distance between the two second connection wires increases gradually in the direction from the first differential wire to the first bonding pad.

* * * * *